United States Patent
Ho et al.

(10) Patent No.: US 6,278,054 B1
(45) Date of Patent: Aug. 21, 2001

(54) SOLAR CELL HAVING AN INTEGRAL MONOLITHICALLY GROWN BYPASS DIODE

(75) Inventors: Frank Ho, Yorba Linda; Milton Y. Yeh, Santa Monica; Chaw-Long Chu, Chino Hills; Peter A. Iles, Arcadia, all of CA (US)

(73) Assignee: Tecstar Power Systems, Inc., City of Industry, CA (US)

( * ) Notice: Subject to any disclaimer, the term of this patent is extended or adjusted under 35 U.S.C. 154(b) by 0 days.

(21) Appl. No.: 09/314,597

(22) Filed: May 19, 1999

Related U.S. Application Data (60) Provisional application No. 60/087,206, filed on May 28, 1998.

(51) Int. Cl.$^7$ .................................................... H01L 31/00
(52) U.S. Cl. ........................ 136/256; 136/255; 136/261; 136/262
(58) Field of Search .................................. 136/256, 255, 136/261, 262

(56) References Cited

U.S. PATENT DOCUMENTS

| | | |
|---|---|---|
| 3,489,615 | 1/1970 | Mann et al. . |
| 3,887,935 | 6/1975 | Fischer et al. . |
| 3,899,689 | 8/1975 | Baker . |
| 3,912,539 | 10/1975 | Magee . |
| 3,956,765 | 5/1976 | Fischer et al. . |
| 4,133,698 | 1/1979 | Chiang et al. . |
| 4,195,621 | 4/1980 | Firebaugh . |
| 4,281,278 | 7/1981 | Bilsky et al. . |
| 4,322,571 | 3/1982 | Stanbery . |
| 4,323,719 | 4/1982 | Green . |
| 4,361,950 | 12/1982 | Amick . |
| 4,367,365 | 1/1983 | Spencer . |
| 4,481,378 | 11/1984 | Lesk . |
| 4,567,316 | 1/1986 | Hollaus et al. . |
| 4,577,051 | 3/1986 | Hartman . |
| 4,610,077 | 9/1986 | Minahan et al. . |
| 4,612,408 | 9/1986 | Moddel et al. . |
| 4,759,803 | 7/1988 | Cohen . |
| 4,771,017 | 9/1988 | Tobin et al. . |
| 4,776,893 | 10/1988 | McLeod et al. . |
| 4,824,489 | 4/1989 | Cogan et al. . |
| 4,909,856 | 3/1990 | Ralph . |
| 4,933,022 | 6/1990 | Swanson . |
| 4,999,524 | 3/1991 | Williams et al. . |
| 5,009,720 | 4/1991 | Hokuyo et al. . |
| 5,011,544 | 4/1991 | Gaddy et al. . |
| 5,043,024 | 8/1991 | Cammerer et al. . |
| 5,131,341 | 7/1992 | Newman . |
| 5,138,403 | 8/1992 | Spitzer . |
| 5,223,043 | 6/1993 | Olsone et al. . |
| 5,230,746 | 7/1993 | Wiedeman et al. . |

(List continued on next page.)

FOREIGN PATENT DOCUMENTS

WO 96/18213  6/1996  (WO) .

OTHER PUBLICATIONS

The Design, Qualification and Use of Bypass Diode Integration Onto GaAs/Ge Solar Cells, R.B. Dally and Kukulka, 25$^{th}$ PVSC; May 13–17, 1996; Washington, D.C.

*Primary Examiner*—Mark Chapman
(74) *Attorney, Agent, or Firm*—Knobbe, Martens, Olson & Bear, LLP (57) ABSTRACT

The present invention is directed to systems and methods for protecting a solar cell. The solar cell includes first solar cell portion. The first solar cell portion includes at least one junction and at least one solar cell contact on a backside of the first solar cell portion. At least one bypass diode portion is epitaxially grown on the first solar cell portion. The bypass diode has at least one contact. An interconnect couples the solar cell contact to the diode contact.

9 Claims, 13 Drawing Sheets

U.S. PATENT DOCUMENTS

| | | |
|---|---|---|
| 5,248,346 | 9/1993 | Fraas et al. . |
| 5,330,583 | 7/1994 | Asai et al. . |
| 5,330,584 | 7/1994 | Saga et al. . |
| 5,342,453 | 8/1994 | Olson . |
| 5,389,158 | 2/1995 | Fraas et al. . |
| 5,391,235 | 2/1995 | Inoue . |
| 5,405,453 | 4/1995 | Ho et al. . |
| 5,449,413 | 9/1995 | Beauchamp et al. . |
| 5,498,297 | 3/1996 | O'Neill et al. . |
| 5,514,223 | 5/1996 | Vogeli . |
| 5,542,988 | 8/1996 | Bogus . |
| 5,567,248 | 10/1996 | Chung . |
| 5,616,185 | 4/1997 | Kukulka . |
| 5,650,019 | 7/1997 | Yamada et al. . |
| 5,684,385 | 11/1997 | Guyonneau et al. . |
| 5,741,370 | 4/1998 | Hanoka . |
| 5,753,319 | 5/1998 | Knapp et al. . |
| 5,895,719 | 4/1999 | Fyles et al. . |

SOLAR CELL HAVING AN INTEGRAL MONOLITHICALLY GROWN BYPASS DIODE

The present application claims priority from U.S. Provisional Patent Application No. 60/087,206 filed on May 28, 1998. The contents of that application, in its entirety, is hereby incorporated by reference.

BACKGROUND OF THE INVENTION

1. Field of the Invention

The present invention relates to solar cells. In particular, the present invention relates to methods and apparatuses for providing a solar cell with an integral diode.

2. Description of the Related Art

Photovoltaic cells, commonly called solar cells, are well-known devices which convert solar energy into electrical energy. Solar cells have long been used to generate electrical power in both terrestrial and space applications. Solar cells offer several advantages over more conventional power sources. For example, solar cells offer a clean method for generating electricity. Furthermore, solar cells do not have to be replenished with fossil fuels. Instead, solar cells are powered by the virtually limitless energy of the sun. However, the use of solar cells has been limited because solar cells are a relatively expensive method of generating electricity. Nonetheless, the solar cell is an attractive device for generating energy in space, where low-cost conventional power sources are unavailable.

Solar cells are typically assembled into arrays of solar cells connected together in series, or in parallel, or in a series-parallel combination. The desired output voltage and current, at least in part, determine the number of cells in an array, as well as the array topology.

As is well known in the art, when all cells in an array are illuminated, each cell will be forward biased. However, if one or more of the cells is shadowed (i.e., not illuminated), by a satellite antenna or the like, the shadowed cell or cells may become reversed biased because of the voltage generated by the unshadowed cells. Reverse biasing of a cell can cause permanent degradation in cell performance or even complete cell failure. To guard against such damage, it is customary to provide protective bypass diodes. One bypass diode may be connected across several cells, or for enhanced reliability, each cell may have its own bypass diode. Multijunction solar cells are particularly susceptible to damage when subjected to a reverse bias condition. Thus, multifunction cells in particular benefit from having one bypass diode per cell.

Conventionally, a bypass diode is connected in an antiparallel configuration, with the anode and the cathode of the bypass diode respectively connected to the cathode and the anode of the solar cell, so that the bypass diode will be reversed biased when the cells are illuminated. When a cell is shadowed, current through the shadowed cell becomes limited and the shadowed cell becomes reverse biased. The bypass diode connected across the shadowed cell in turn becomes forward biased. Most of the current will flow through the bypass diode rather than through the shadowed cell, thereby allowing current to continue flowing through the array. In addition, the bypass diode limits the reverse bias voltage across the shadowed cell, thereby protecting the shadowed cell.

Several different conventional methods have been used to provide solar cells with bypass diode protection. Each conventional method has its drawbacks. For example, in an attempt to provide increased bypass protection, one method involves locating a bypass diode between adjacent cells, with the anode of the bypass diode connected to one cell and the cathode of the diode connected to an adjoining cell. However, this technique requires that the cells be assembled into an array before the bypass diode protection can be added. This assembly method is difficult and inefficient. Furthermore, this technique requires the bypass diodes to be added by the array assembler, rather than the cell manufacturer. In addition, this technique requires the cells to be spaced far enough apart so as to accommodate the bypass diode. This spacing results in the array having a lower packing factor, and thus, the array is less efficient on an area basis.

Another conventional technique providing a bypass diode for each cell requires that a recess be formed on the back of the cell in which a bypass diode is placed. Each cell is provided with a first polarity contact on a front surface of the cell and a second polarity contact is provided on a back surface of each cell. An "S" shaped interconnect must then be welded from a back surface contact of a first cell to a front surface contact of an adjoining cell. Thus, this technique disadvantageously requires the cells to be spaced far enough apart to accommodate the interconnect which must pass between the adjoining cells. Additional disadvantages of this method include the possibility of microcracks generated during formation of the recess. In addition, this technique requires a thick bondline of adhesive, thereby adding stress-risers, increasing stresses generated during temperature cycling. Furthermore, the present conventional technique requires the connection of the interconnect to the adjoining cell to be performed by the array assembler as opposed to the cell manufacturer.

SUMMARY OF THE INVENTION

One embodiment of the present invention advantageously provides methods and systems for efficiently providing an integral bypass diode on a solar cell. In one embodiment, the solar cell is a multijunction cell. The bypass diode is monolithically grown over at least a portion of the solar cell. In another embodiment, the solar cell is formed from at least group III, IV, or V materials. In still another embodiment, the diode includes at least an N-type GaAs layer and a P-type GasAs layer. In yet another embodiment, the diode is formed using lower bandgap materials, such as germanium or InGaAs.

In one embodiment, the solar cell includes a germanium Ge substrate. The Ge substrate may further include a photoactive junction. In yet another embodiment, the substrate is formed from at least one of the following materials: semiconductors, such as GaAs, Si, or InP, and insulators, such as sapphire. In one embodiment, the substrate is a single crystal.

In yet another embodiment, a C-clamp conductor interconnects at least one solar cell contact to at least one bypass diode contact. In another embodiment, an integrally metallized layer is used to interconnect at least one solar cell contact to at least one bypass diode contact. In still another embodiment, the integrally metallized layer is deposited over an insulating layer to prevent the integrally metallized layer from shorting to one or more other layers.

In one embodiment, a cap layer interconnects a first diode polarity with the solar cell. In yet another embodiment, the bypass diode is epitaxially grown on a solar cell having one or more junctions. In still another embodiment, the solar cell may be formed from at least one or more of the following materials: GaAs, InP, GaInP$_2$, and AlGaAs. In another embodiment, other III–V compounds are used to form at least a portion of the solar cell.

BRIEF DESCRIPTION OF THE DRAWINGS

These and other aspects, advantages, and novel features of the invention will become apparent upon reading the following detailed description and upon reference to accompanying drawings in which.

DETAILED DESCRIPTION OF THE PREFERRED EMBODIMENTS

The present invention relates to a solar cell with at least one integral bypass diode. The solar cell may be a single junction or multijunction cell. As discussed below, in one embodiment, a bypass diode is epitaxially grown on a multijunction solar cell. The solar cell/bypass diode device may be interconnected with other solar cells to form series and/or parallel strings of solar cells. The strings may be further connected to form a reliable and robust solar cell array. The solar cell array may be mounted to a space vehicle, thereby providing power to the space vehicle.

Figure 1:
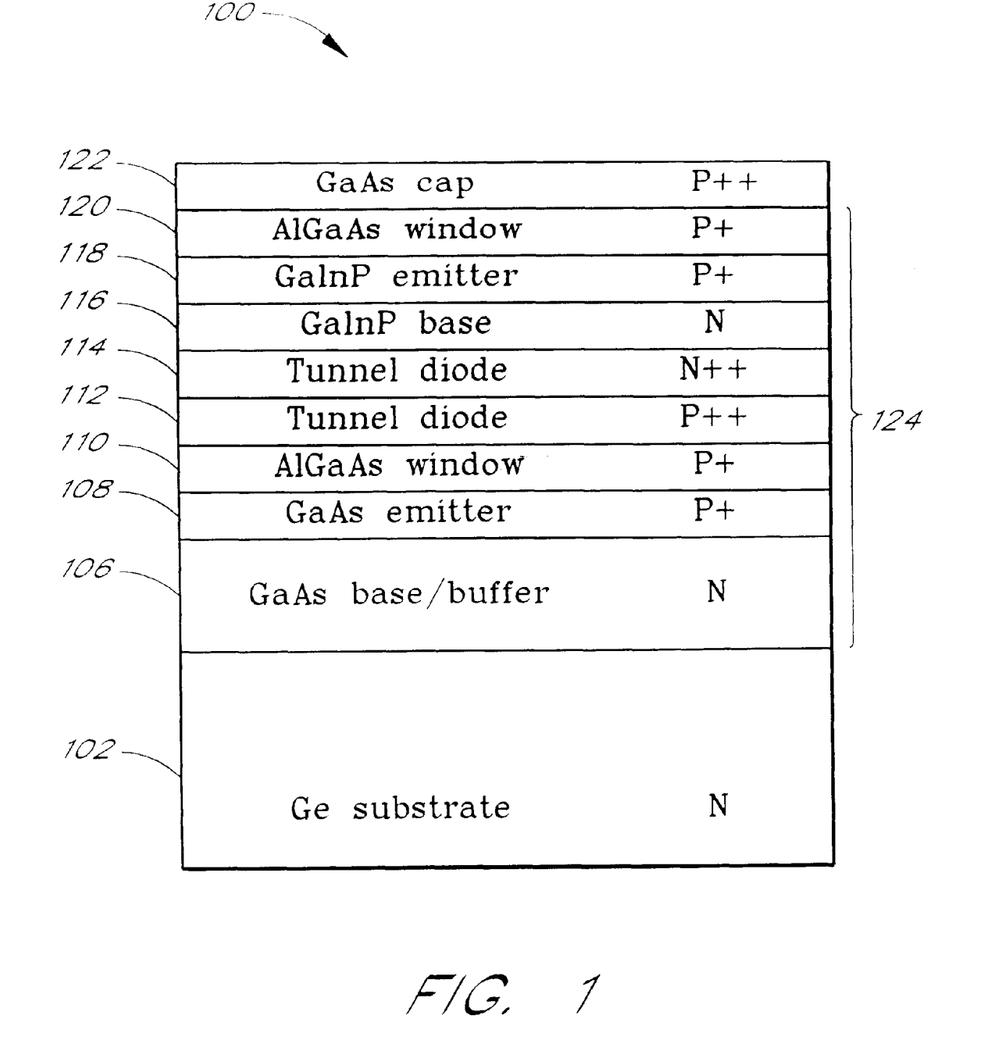
FIG. 1 illustrates a first processing step used to construct one embodiment of the present invention.

FIG. 1 shows a sequence of III–V layers 106–122 which are grown sequentially on a Ge substrate 102 in one embodiment of the present invention to form a multijunction solar cell 100. The Ge substrate 102 may further include a photoactive junction. In one embodiment, the layers are epitaxially grown, meaning that they replicate the single crystalline structure of material. The growth parameters (deposition temperature, growth rate, compound alloy composition, and impurity dopant concentrations) are preferably optimized to provide layers with the desired electrical qualities and thickness, to thereby obtain the required overall cell performance. The epitaxial techniques which may be used to grow the cell layers include, by way of example, MOCVD (metal-organic chemical vapor deposition) epitaxy, sometimes called OMVPE (organic-metallic vapor phase epitaxy), MBE (molecular beam expitaxy), and MOMBE (metal-organic molecular beam epitaxy).

In the illustrated embodiment, an N doped GaAs base layer 106 is grown over and overlays at least a portion of the substrate 102. At the interface between layer 102 and layer 106 a photoactive junction is formed. In one embodiment, the photoactive junction is an N+GaAs/N+Ge heterodiode In another embodiment, if an N/P configuration is to be grown, a P-type Ge substrate 102 is used, and diffusion of As from the layer 106 forms an N/P junction in the substrate 102.

As illustrated in FIG. 1, a highly P doped GaAs emitter layer 108 is grown over at least a portion of the GaAs base layer 106. The base layer 106 and the emitter layer 108 together form a lower cell stage. A highly P doped AlGaAs window layer 110 overlays the emitter layer 108. A tunnel diode, including very highly doped P and N layers 112, 114 is grown over the window layer 110. A second, or upper cell stage, including an N doped base layer 116 and a highly P doped emitter layer 118, is formed over the tunnel diode.

In one embodiment, the last two layers grown for the solar cell are respectively a highly P doped AlGaAs window 120, which is a thin, transparent layer that passivates (reduces carrier recombination) the surface of the emitter layer 118 of the top cell (GaInP$_2$), and a GaAs cap-layer 122 onto which the front surface ohmic contacts are deposited. In one embodiment, the contacts are in grid-finger form, to balance low electrical resistance and high optical transparency. However, other contact patterns may e used as well. In the present embodiment, as described below, the integral bypass diode is included in the monolithically-grown cell structure by the growth of several additional layers. The cap layer 122 is selectively removed between the gridlines, and anti-reflective coatings are deposited over the top window layer 120.

It will be understood by one of ordinary skill in the art, that the three-cell, three-junction, solar cell 100, illustrated in FIG. 1, is only one of many possible cell embodiments which can be used with the present invention. In another embodiment, a complementary structure, with the polarities of one or more layers switched (i.e. N doped layers are, instead, P doped, and P doped layers are, instead, N doped), may be used. For example, the cell and diode configurations illustrated in the figures and discussed below, can be changed from P/N to N/P. Also, the doping concentrations or layer thicknesses may be varied. Furthermore, in other embodiments, the solar cell 100 may include four or more photovoltaic cells, or only one or two cells. Similarly, the solar cell may alternatively include only one junction or two or more junctions. By way of example, in one embodiment, the cell 100 may include four junctions.

Furthermore, the solar cell 100 may include cells made from other materials, such as AlGaAs or InP. In other embodiments, the substrate 102 may be formed using a variety of different materials. For example, the solar cell 100 may use other semiconductors, such as GaAs, Si, or InP for the substrate, rather than the Ge substrate 102 illustrated in FIG. 1. Alternatively, insulating substrates, such as sapphire, may be used. In one embodiment, the substrate 102 is a single crystal. If the solar cell 100 is intended for space use, such as on a space vehicle or satellite, then the cell materials are preferably space-qualified for the appropriate space environment. For example, the solar cell 100 and bypass diode may be space qualified to operate in an AM 0 radiation environment.

Figure 2:
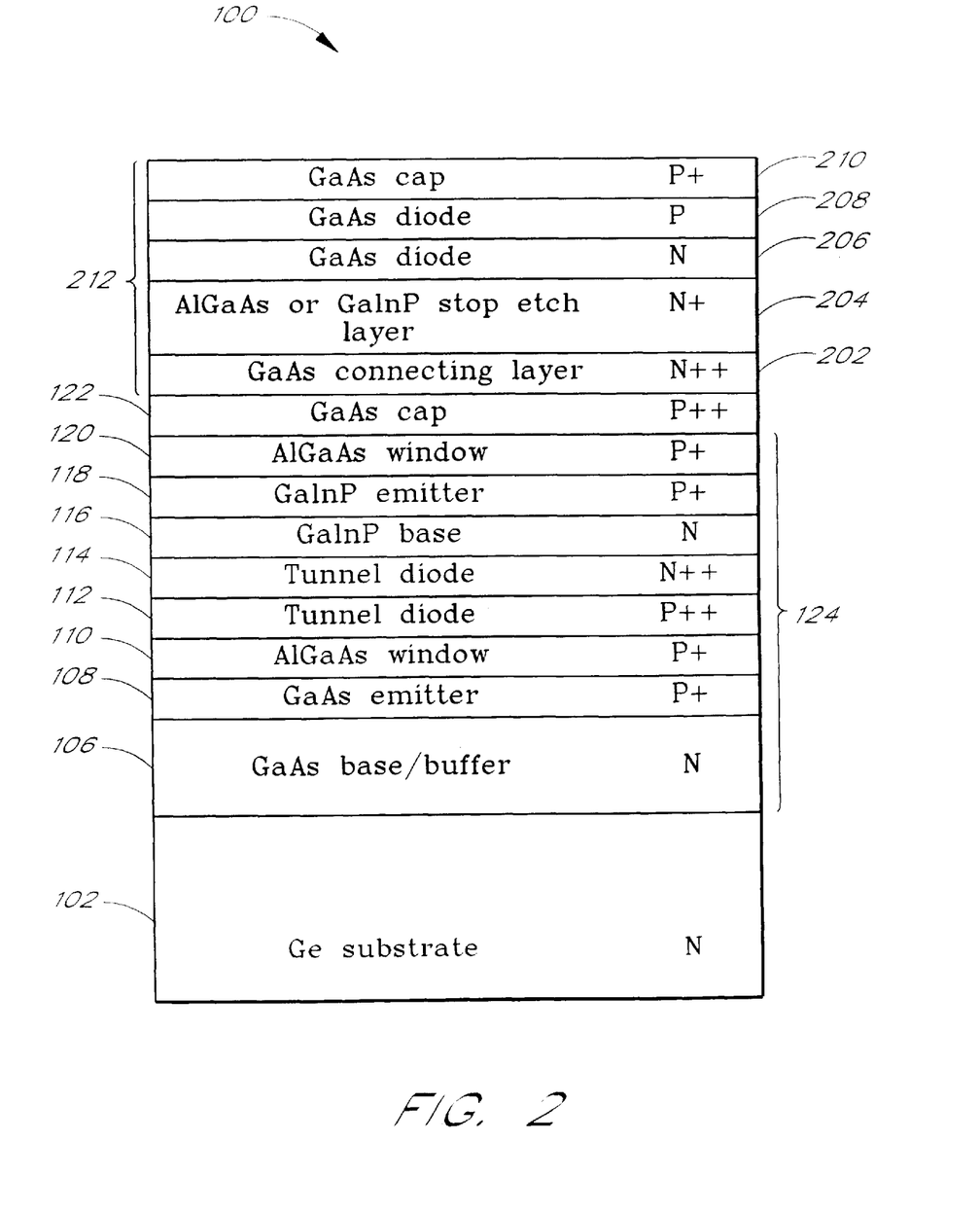
FIG. 2 illustrates a second processing step used to construct one embodiment of the present invention.

One method of fabricating the bypass diode will now be described. As illustrated in FIG. 2, the bypass diode 212 is included in the solar cell structure using additional five grown layers 202, 204, 206, 208, 210.

As previously described, in one embodiment, the layers 106–122, comprising the photovoltaic portions of the multijunction solar cell 100, are first grown, and the growth cycle is continued to grow the additional layers 202–210. From the P-type GaAs cap layer 122 used for front grid contacts, the additional layers in order are:

the highly doped N-GaAs connecting layer 202 used to reduce contact resistance to the N-GaAs diode layer 206 and to the highly doped GaAs cap layer 122.

the stop-etch layer 204 (highly N-doped AlGaAs or GaInP) used to allow controlled etch-removal of the three diode layers 206–210.

the N doped GaAs layer 206, comprising the negatively doped part of the bypass diode 212.

the P doped GaAs layer 208, comprising the positively doped part of the of the bypass diode 212.

the highly doped P-GaAs cap layer 210, used to provide good metallic contact to the P-layer 208 of the diode 212.

However, as will be appreciated by one of ordinary skill in the art, other embodiments of the present invention may utilize a different number of layers, formed from different types of materials, and having different dopants than the embodiment described above. For example, the use of the complementary structure, that is, N/P rather than P/N, can similarly consist of N/P multijunction solar cells, and an N/P bypass diode. Also, the diode 212 may be formed using lower bandgap materials, such as germanium or InGaAs. In another embodiment, the layer 202 may be omitted, leaving the layer 204 to provide stop-etching and electrical conduction.

A description of one method of processing a wafer to form one embodiment of the invention will now be described. In the present embodiment, the process steps are used to grow, define by mesa etch, and interconnect one embodiment of the bypass diode 212 into the cascade (multijunction) cell 100.

Figure 3:
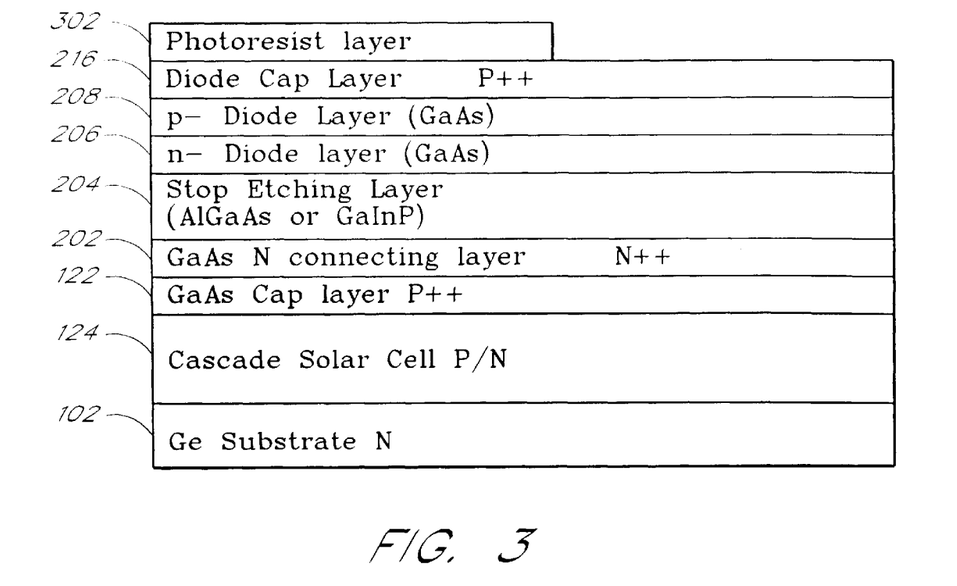
FIG. 3 illustrates a third processing step used to construct one embodiment of the present invention.
Figure 4:
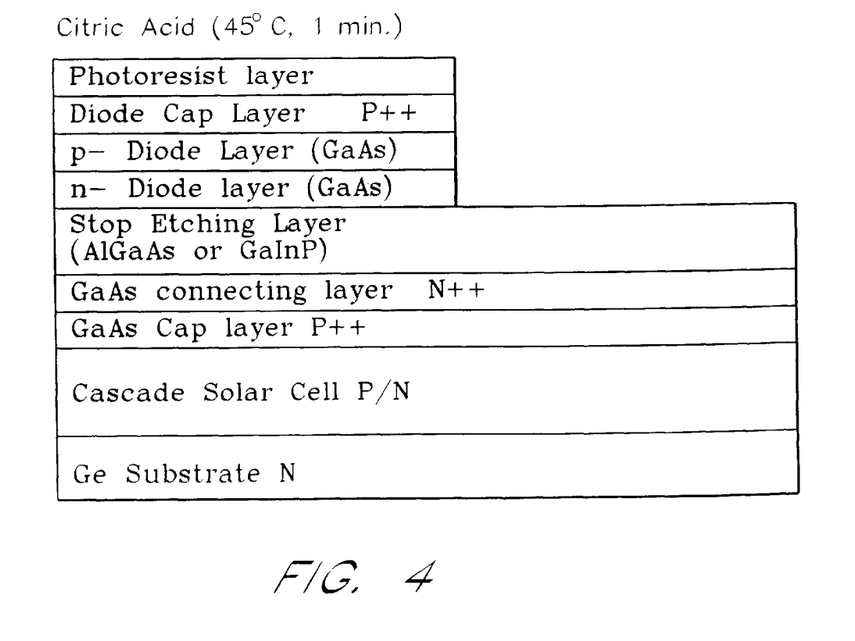
FIG. 4 illustrates a fourth processing step used to construct one embodiment of the present invention.
Figure 5:
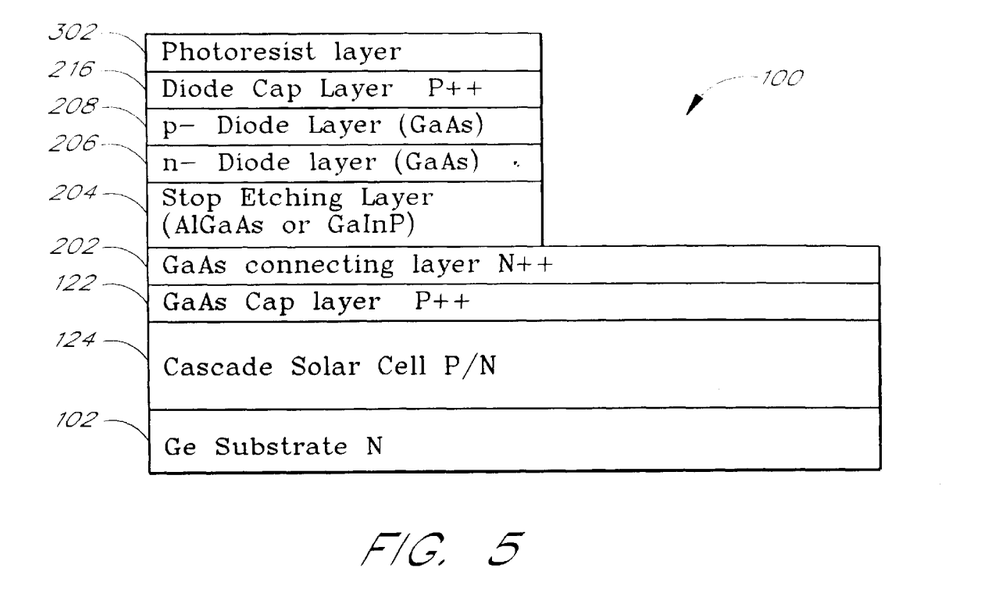
FIG. 5 illustrates a fifth processing step used to construct one embodiment of the present invention.
Figure 6:
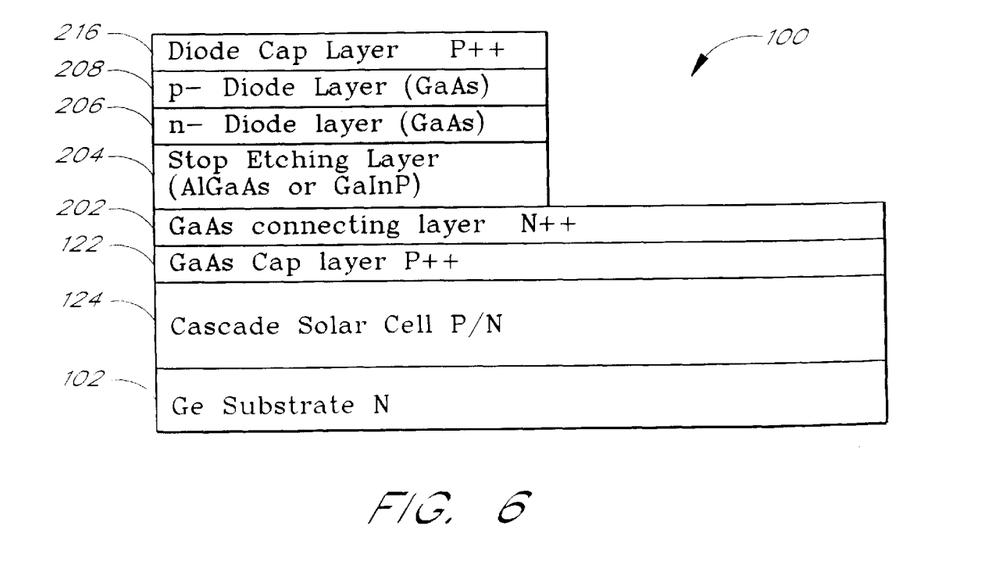
FIG. 6 illustrates a sixth processing step used to construct one embodiment of the present invention.

First, the photoactive solar cell layers and the diode layers illustrated in FIG. 2 are epitaxially grown using conventional MOCVD and/or MBE technologies. As illustrated in FIG. 3, the front surface of the grown layer sequence is protected with a photoresist layer 302, which is exposed through a photomask (not shown) patterned to leave the diode layers covered with resist. As illustrated in FIG. 4, the diode cap layer 210 and the N and P diode layers 206, 208 are etched down to the stop-etch layer 204. The etching may be performed using citric acid heated to 45° C. As illustrated in FIG. 5, the stop etch layer 204 is removed where the photoresist layer 302 does not mask, and appropriate portions of the N doped GaAs connecting layer 202 is exposed. If the stop etch layer 204 is AlGaAs, then in one embodiment, the etchant may be BHF (buffered hydrofloric) acid. If the stop etch layer 204 is GaInP, then in another embodiment, the etchant may be HCl. As illustrated in FIG. 6, the photoresist layer 302 is removed using acetone. Microstripping techniques may be used to remove any residual photoresist left remaining after the acetone removal process.

Figure 7:
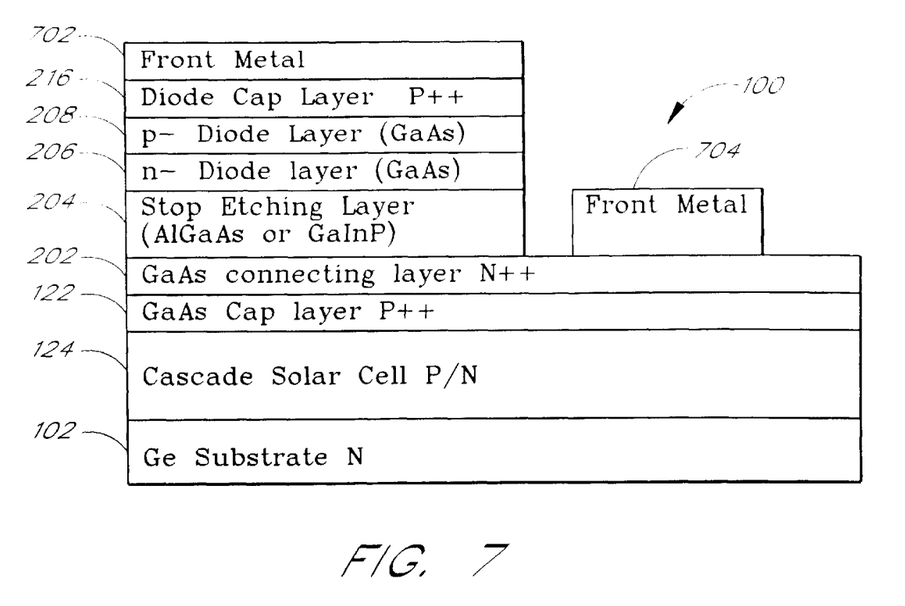
FIG. 7 illustrates a seventh processing step used to construct one embodiment of the present invention.

Once the photoresist layer 302 is removed, the front contact fabrication process, including corresponding photoresist coating, baking, exposing, developing, metal evaporation, and lift off operations, can take place. Another photoresist layer (not shown) is coated over the whole surface. The photoresist layer is then baked and exposed with a photomask which leaves opened areas where contacts are to be deposited to the front surface gridlines and pads, to a small region of the exposed N doped GaAs layer 202, and to the diode cap layer 210. Metals, predominantly including Ag, are evaporated into the exposed areas and over the remaining photoresist layer. In addition to the two contact areas 702, 704 illustrated in FIG. 7, the photoresist also provides open slots in the photoresist, to provide gridlines, and bars/pad contacts to the cell. Next, a lift-off process is performed. The solar cell slice 100 is immersed in acetone, causing the photoresist to swell, and thereby breaks the metal film everywhere except on the regions designated to retain contacts, including contacts 702, 704.

Figure 8:
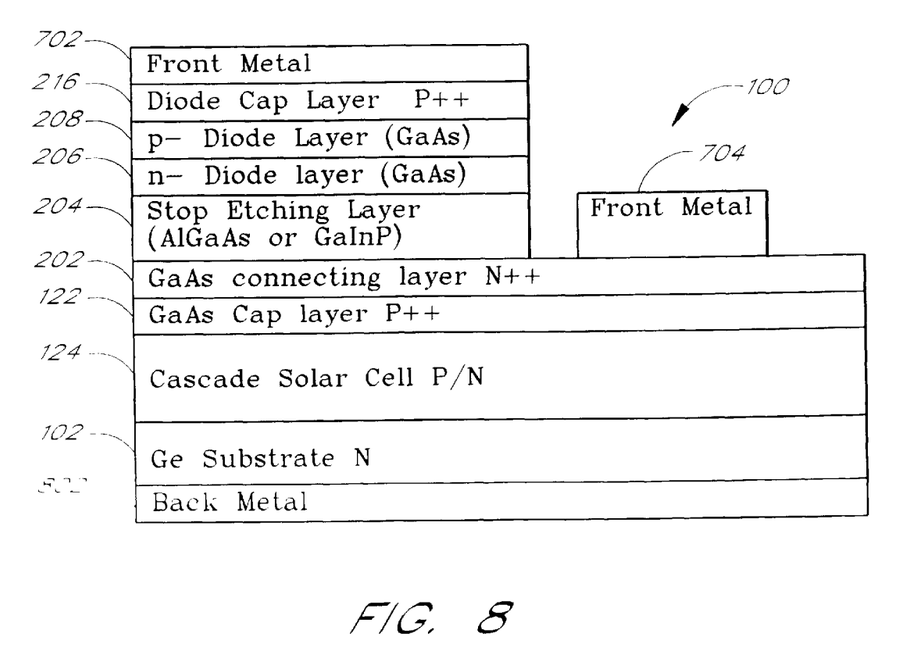
FIG. 8 illustrates an eighth processing step used to construct one embodiment of the present invention.
Figure 9:
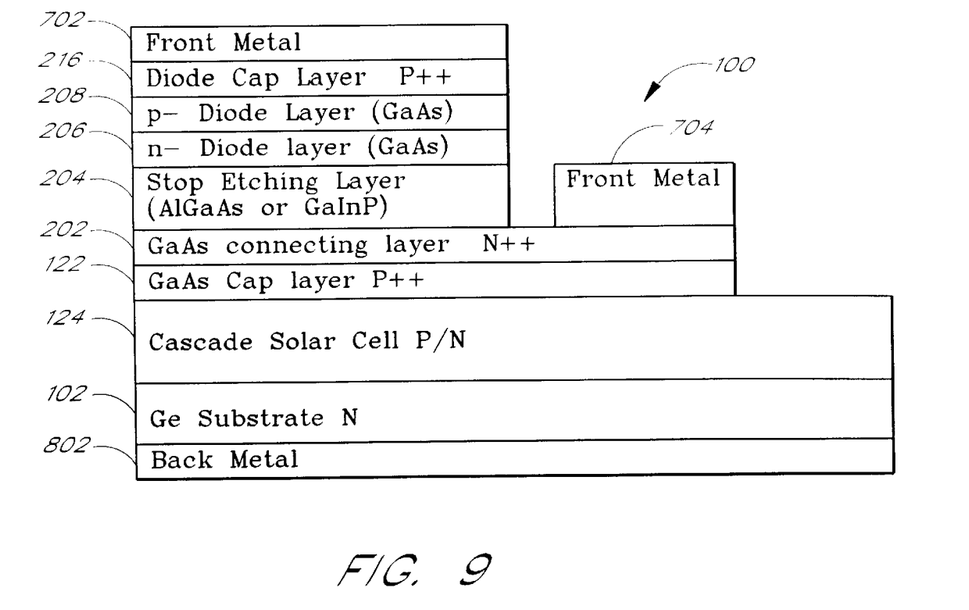
FIG. 9 illustrates a ninth processing step used to construct one embodiment of the present invention.

As illustrated in FIG. 8, metals, predominantly including Ag, are evaporated over the back surface of the Ge substrate 102 to form a back metal contact 802. The contacts 702, 704, 802 are then heat-treated or sintered. Using the front contact metals 702, 704 as etch-masks, the GaAs cap layer 122 is etched off the major part of the exposed front surface, as illustrated in FIG. 9. The cap layer 122 remains under the metallized areas, forming part of a low resistance contact mechanism.

Figure 10:
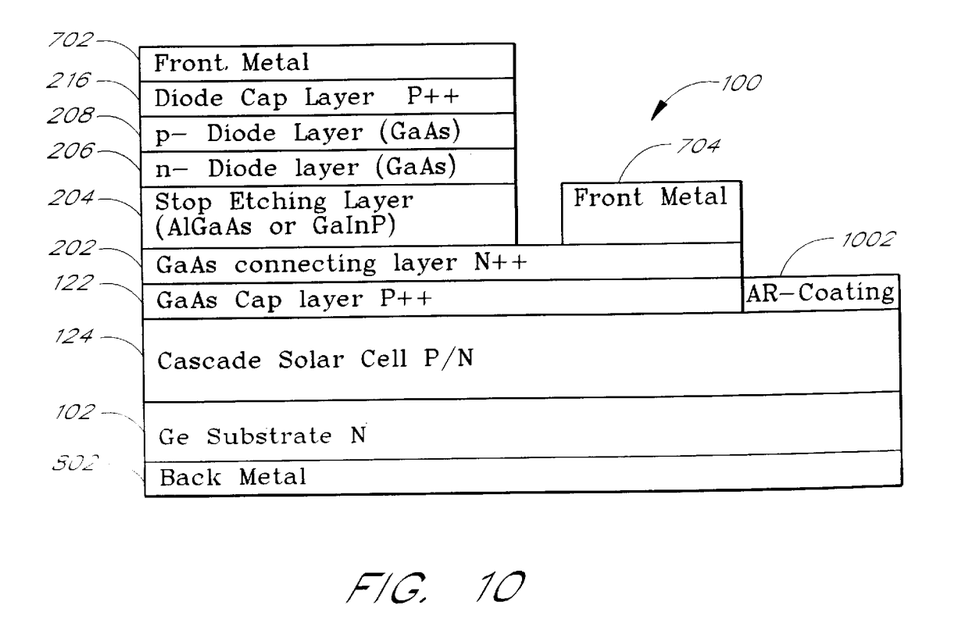
FIG. 10 illustrates a tenth processing step used to construct one embodiment of the present invention.
Figure 11:
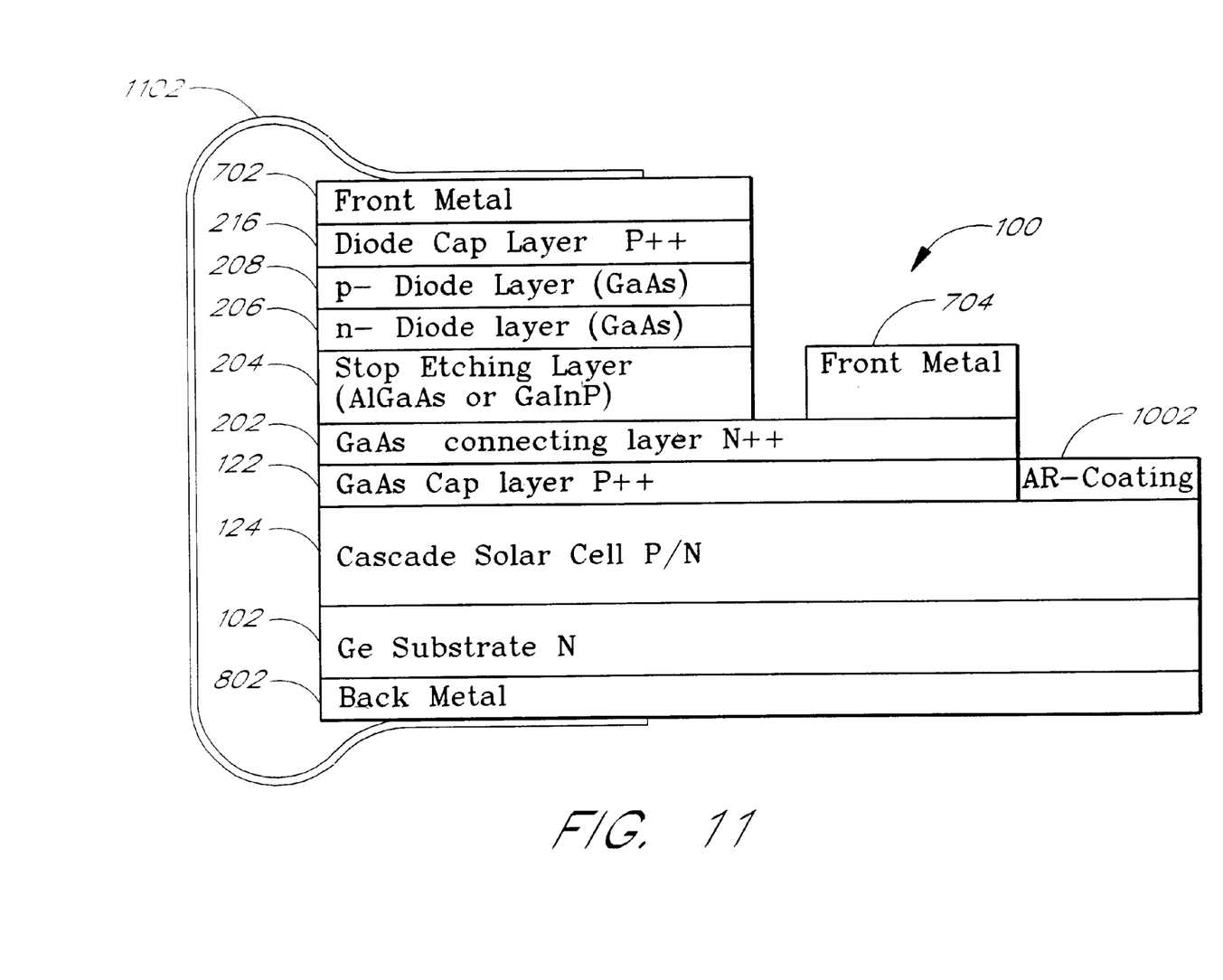
FIG. 11 illustrates one embodiment of the present invention, including a discrete interconnect.

As illustrated in FIG. 10, the diode pad metal contacts 702, 704, and the small contacts shown around the diode 212 are protected with a resist mask, and on the rest of the surface, an anti-reflecting layer 1002 is deposited. As illustrated in FIG. 11, the top, P-side, diode contact 702 is connected to the back cell (N-grid) contact 802 by bonding a thin interconnect 1102. Thus, in one embodiment, the electrical connection between the P-layer 208 of the P/N GaAs diode 212 and the backside of the N doped Ge substrate 102 is formed by a C-clamp 1102, which is bonded to both the front diode contact 702 and the rear Ge contact 802. Thus, the bypass diode 212 is connected across both of the photovoltaic cells. In other embodiments, the bypass diode may be used to bypass one or more photovoltaic cells. Thus, one embodiment of the present invention can be used to bypass all the cells in a solar cell structure 100, or less than all the cells in the solar cell structure 100.

A variety of other interconnect techniques may be used to connect the solar cell to the bypass diode. The final choice may depend on the additional complexity and the effect on cell yields and costs which results from the use of these alternative approaches. By way of example, descriptions of several others follow.

Figure 12:
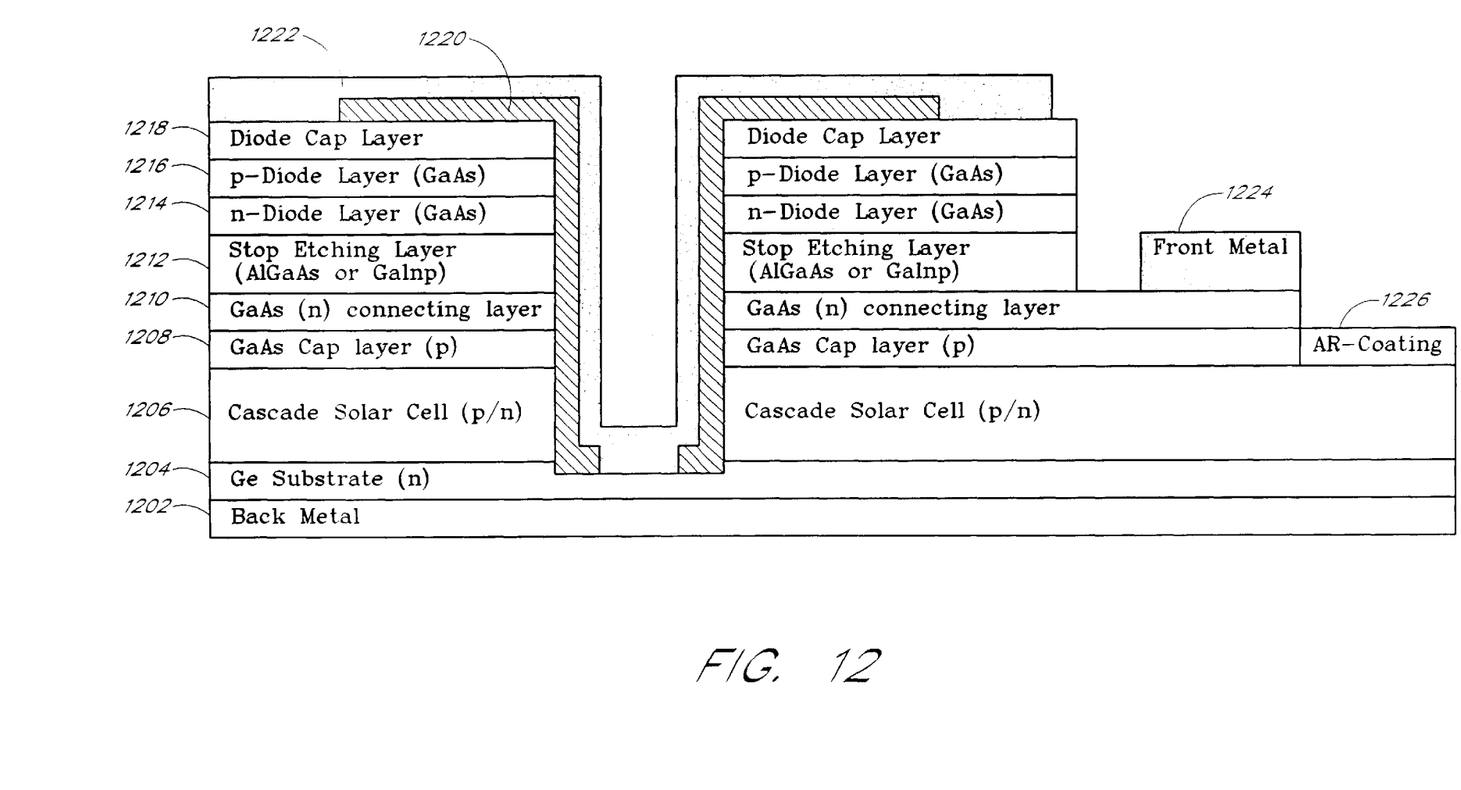
FIG. 12 illustrates one embodiment of the present invention, including an integral interconnect.

As illustrated in FIG. 12, in one embodiment, a short contact between the diode top contact and a metallized area on a small trough etched down through the cascade cell layers 1206–1218 to expose the Ge substrate 1204 may be used, rather than a C-clamp. The trough may remove less than 1% of the active cell area, and may be located close to the top contact of the bypass diode. As in the previous embodiment, the embodiment illustrated in FIG. 12 includes a front metal contact 1224, a rear metal contact 1202, and an anti-reflective coasting 1226. Several different contact configurations may be used.

By way of example:

a) In one embodiment (not shown), a short discrete metal interconnect is bonded to the diode contact at one end, and is bonded directly to the Ge surface exposed in the trough. Preferably, the interconnect is gold-plated. A variety of techniques may be used to make the bond. In one embodiment, the bond is made using eutectic Au—Ge soldering.

b) If (a), direct bonding to the Ge surface is difficult or undesirable, then, in another embodiment, an additional step may be added to the normal cell processing. The front surface is masked at substantially all regions except where the Ge contact area is needed using dry film or liquid photoresist. Then, when the front metal contacts are deposited through another photoresist mask to form the grid, ohmic and diode contacts, the edges of the trough may be protected with resist by using an opened area just inside the etched area. The metal for contacting the N—Ge may be deposited in the same or a similar deposition sequence as when the front contacts to the cascade cell 100 and the diode contacts 702, 704 are formed. In the present case, TiAuAg or equivalent contacts may serve for the exposed areas on the front surface. A short discrete metal interconnect is bonded to the diode P-contact and the contact to the N—Ge.

c) As illustrated in FIG. 12, in a filly monolithic structure, a trough or recess is etched to the Ge interface 1204 through the diode and cell layers 1206–1218. Thus, the wall or walls of the trough are formed by the cell layers. A mask is then used to expose the edges of the trough, and an insulating layer 1220 is deposited on the layer edges and on the area between the diode cap layer 1218 and the trough. Another mask, which can be included in the main front contact mask, is used to deposit metal 1222, which connects the front contact of the diode to the trough exposing the Ge substrate 1204. In another embodiment, no diode contacts are necessary for the substrate-to-diode interconnect 1222.

Figures 13A, 13B:
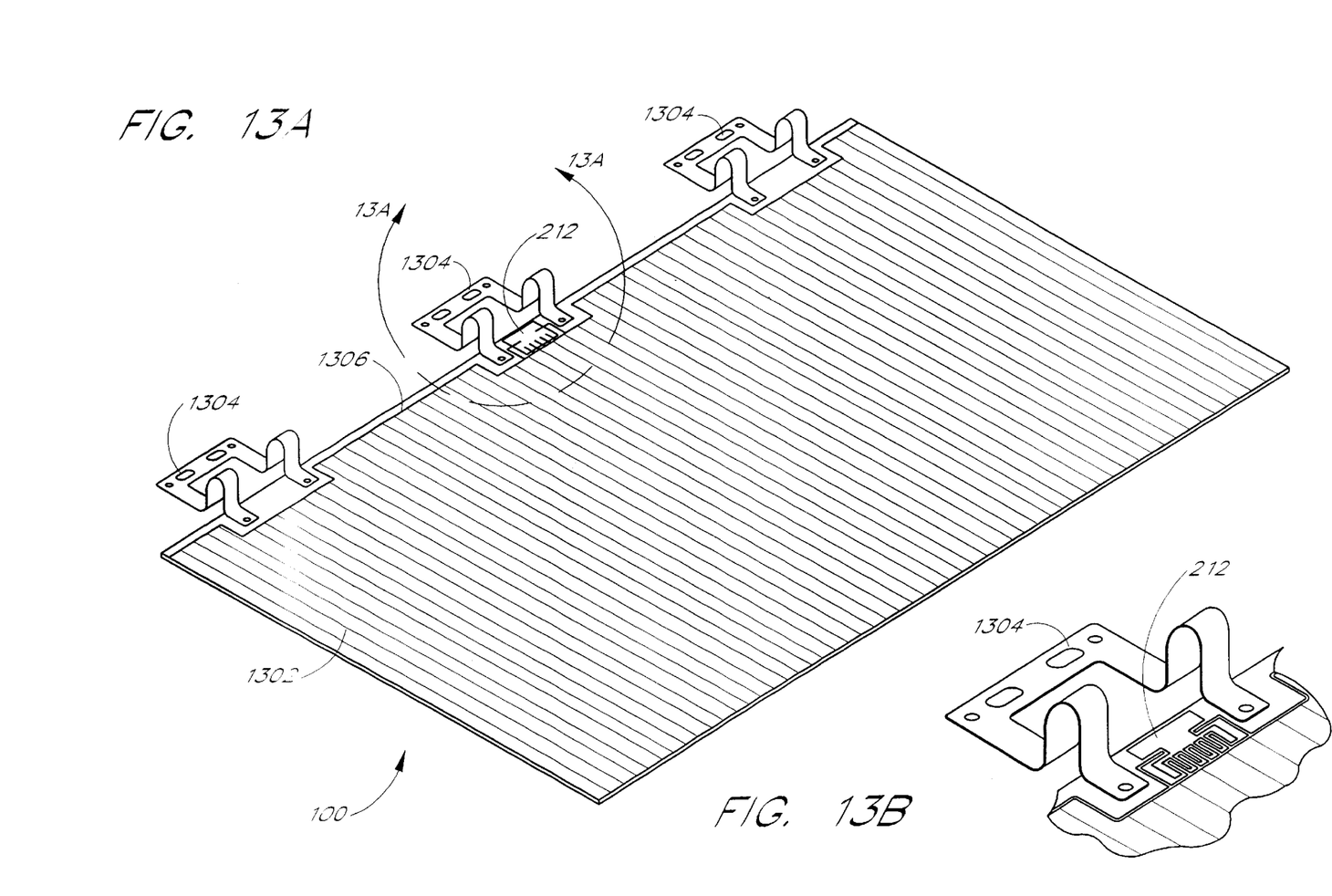
FIG. 13A illustrates a perspective view of one embodiment of the present invention.
FIG. 13B illustrates in greater detail the bypass diode illustrated in FIG. 13A.

FIG. 13A illustrates a perspective view of one embodiment of the solar cell 100, including the bypass diode circuit 212. The front surface of the solar cell 100 includes grid lines 1302 interconnected by an ohmic bar 1306. The bar 1306 is shaped to provide an area or recess where the diode 212 is formed. In one embodiment, the diode 212 is interconnected to the back contact 802 of the solar cell 100 using the C-clamp connector 1102 illustrated in FIG. 11. FIG. 13B illustrates in greater detail the bypass diode 212 illustrated in FIG. 13A. In one embodiment, the sides of the diode 212 are interdigitated with the ohmic bar 1306. Thus, the distance between the diode 212 and the bar 1306 is reduced. and more of the bar 1306 is in proximity with the diode 212.

As illustrated in FIG. 13A, in one embodiment, three tabs 1304 are mounted on the solar cell 100 for interconnection to an adjoining assembly. The tabs 1304 may include a U-shaped stress relief section, also called a Z-tab. A first side of each of the tabs 1304 is connected to an anode of the cell 100. The solar cell 100 may be interconnected to a second solar cell by connecting a second side of the tabs 1304 to a cathode of the second solar cell. In one embodiment, the tabs are formed from silver, silver-Invar, or silver-clad molybdenum materials.

A coverglass (not shown) may be used to protect the solar cell/bypass diode device. For space applications, the coverglass may be composed of ceria-doped borosilicate coverglass. In one embodiment, the coverglass may have a thickness around 50 $\mu$m to 200 $\mu$m. The ceria-doped coverglass provides radiation resistant shielding for charged and uncharged particles. In one embodiment, the coverglass will remain substantially transparent when exposed to an AM 0 space radiation environment spectrum (the spectrum found at Earth's orbit around the sun, outside of Earth's atmosphere). A major advantage of one embodiment of the integral bypass diode is that the diode does not extend above the front surface of the solar cell 100, and therefore does not require the use of a notched or slotted coverglass to accommodate the integral diode. However, in another embodiment, the integral diode may extend above the front or top surface of the solar cell 100. One skilled in the art will understand that other suitable coverglass materials and dimensions can be used as well.

Figure 14A:
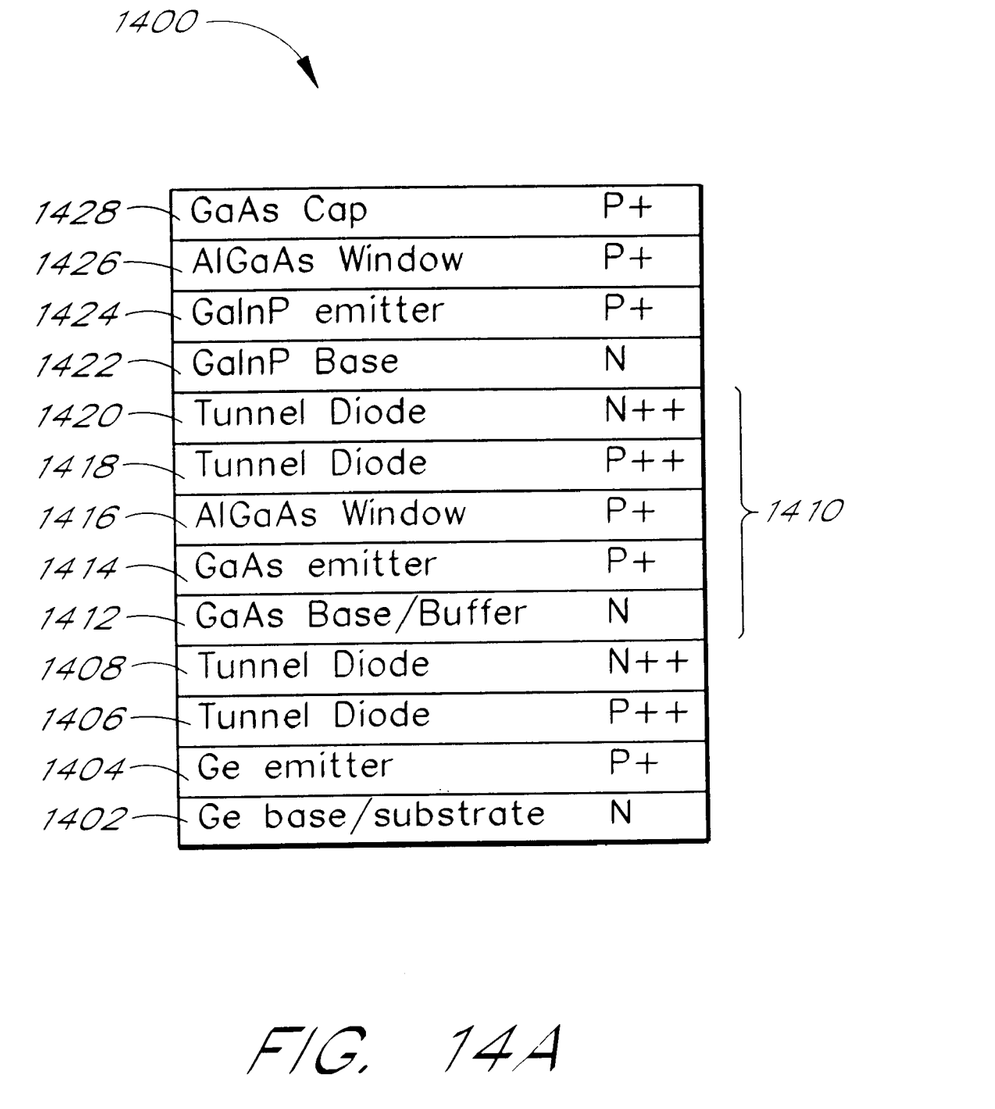
FIG. 14A illustrates one embodiment of the present invention with a buried bypass diode.

FIG. 14A illustrates still another embodiment of the present invention. The illustrated solar cell 1400 includes a novel buried protective bypass diode 1410. As with the bypass diode 212, the protective bypass diode 1410 is used to protect the solar cell from reverse bias conditions which can result from the shadowing of the cell.

The exemplary grown layer sequence illustrated in FIG. 14A is similar to that of FIG. 1A. Two additional buried layers 1406, 1408 are provided for polarity matching with the Ge+ emitter 1404. The solar cell 1400 includes a Ge substrate 1402 over which the Ge emitter layer 1404 is grown. Isolated diode layers 1412–1420 form a portion of the bypass diode function. Layers 1422, 1424 form the conventional top cell, over which is a window layer 1426, and a cap layer 1428. In another embodiment, a complementary structure, with the polarities of one or more layers switched from those illustrated in FIG. 14A (i.e. P doped layers are, instead, N doped, and N doped layers are, instead, P doped), may be used.

Figure 14B:
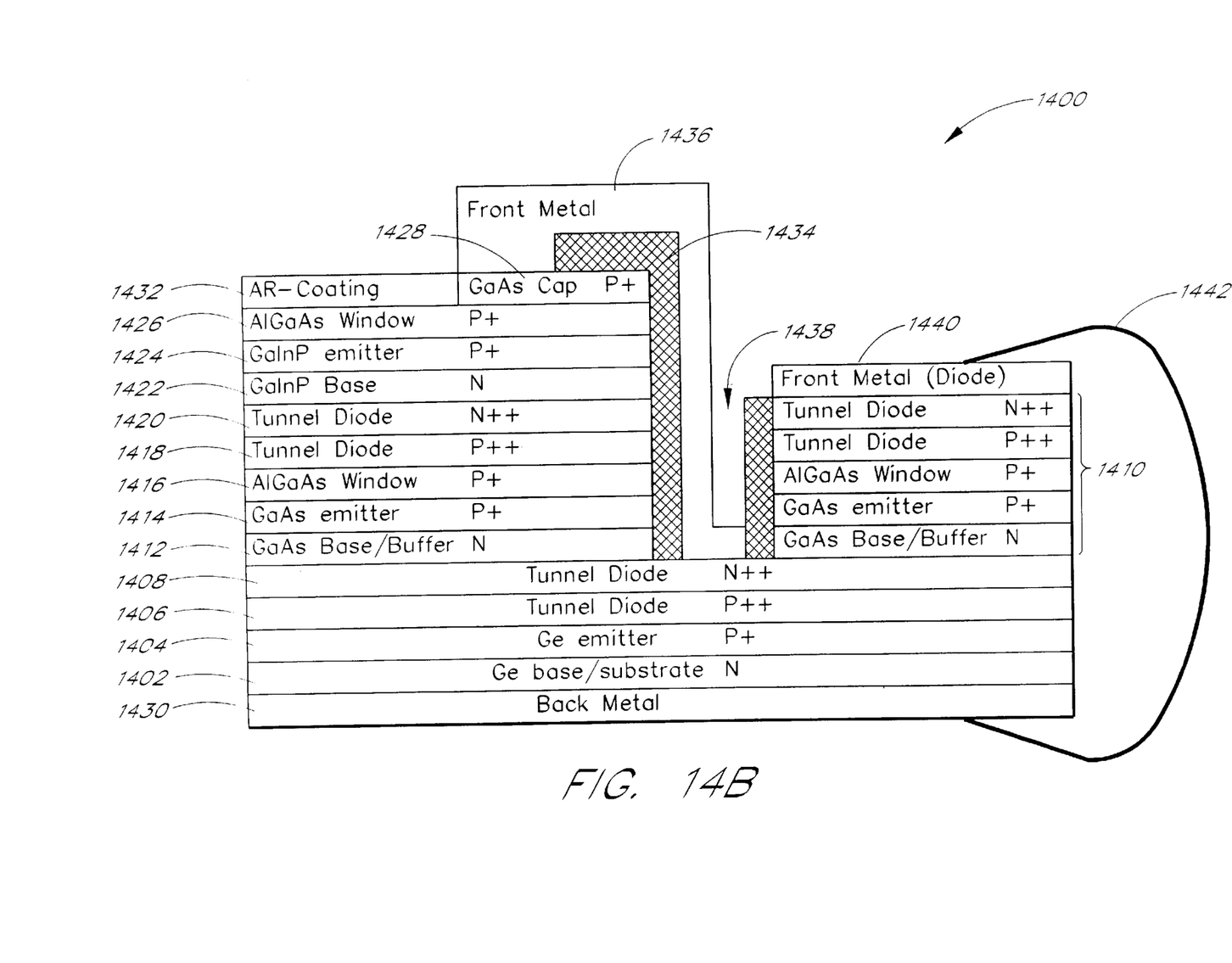
FIG. 14B illustrates the embodiment of FIG. 14A after further processing acts are performed.

As similarly described above, the solar cell is processed, and, as illustrated in FIG. 14B, a back metal contact 1430 and a front metal diode contact 1440 are formed. In addition, an anti-reflective coating 1432 is applied.

In one embodiment, a short integral connector 1436 is formed over an insulator 1434 from the cap layer 1428 on a small trough 1438 etched down through the cell layers 1420–1412 to the tunnel diode layer 1408. An interconnect, such as a C-clamp 1442, may then be used to connect the front metal contact 1440 and the back metal contact 1430. Thus, the bypass diode 1410 is connected in an anti-parallel configuration with respect to the photovoltaic portions of the solar cell 1400 and thereby is configured to provide reverse bias protection to the photovoltaic portions of the solar cell 1400.

Using at least some of the techniques described above, a solar cell incorporating an integral diode onto cascaded cells has achieved efficiencies of well over 21%, and even over 23.5%. These efficiencies are comparable to conventional cascade cells lacking the integral bypass diode. In one embodiment, the integral bypass diode has a forward bias voltage drop of approximately 1.4 to 1.8 volts when conducting 400 mA of forward current. The reverse breakdown voltage is sufficient to block current passing into the bypass diode when the solar cell is forward biased during normal, unshadowed, illumination. In one embodiment, the reverse breakdown voltage is greater than 2.5V. Furthermore, samples of one embodiment of the present invention, with cell areas of approximately 24 $cm^2$, have sustained repeated 10-second pulses of 400 mA of reverse current with no significant change in performance. Thus, for example, when one batch of solar cells incorporating one embodiment of the integral diode were subjected to 2500 pulses of 400 mA reverse current, the following performance changes were observed:

| Parameter | Pre-test Measurement | Post-test Measurement |
| --- | --- | --- |
| VOC (OPEN CIRCUIT VOLTAGE) | 2476 mV | 2476 mV |
| ISC (SHORT CIRCUIT CURRENT) | 360.5 mA | 359.0 mA |
| CFF (CURVE FIELD FACTOR) | 81.5% | 81.5% |
| Efficiency | 22.1% | 22% |

In other testing, when a reverse current greater in magnitude than ISC passed through the solar cell 100, the area around the diode showed an increase in temperature of only 10–12° C. This small increase in temperature does not have an appreciable affect, either on the performance of the photovoltaic portions of the cell, or on the integral diode.

In another preferred embodiment, the solar cell design described above is modified to even further facilitate its use in either space-based or terrestrial-based concentrator systems. Just as in non-concentrator systems, there is a need to protect against shadowing of the solar cells from clouds, birds, buildings, antennas, or other structures. Thus, protective diodes are still used to protect solar cells from reverse bias conditions resulting from shadowing. However, solar cells in concentrator assemblies typically generate much more power than non-concentrator solar cells. Thus, the protective diodes need to be capable of dissipating heat associated with the much greater power that is bypassed.

In one embodiment, distributing multiple separated bypass integral diodes across at least a portion of the surface of the solar cell helps distribute the heat dissipation. Thus, each of the multiple integral diodes bypasses a portion of the reverse bias power, and correspondingly dissipates a portion of the associated heat. Thus, a single integral diode does not have to bypass all the reverse bias power or dissipate all the heat associated with such bypass function. The multiple integral bypass diodes may be formed using the same technique described above with regard to forming one integral diode. In one embodiment, different photomasks are used to form the diodes and diode contacts.

Figure 15A:
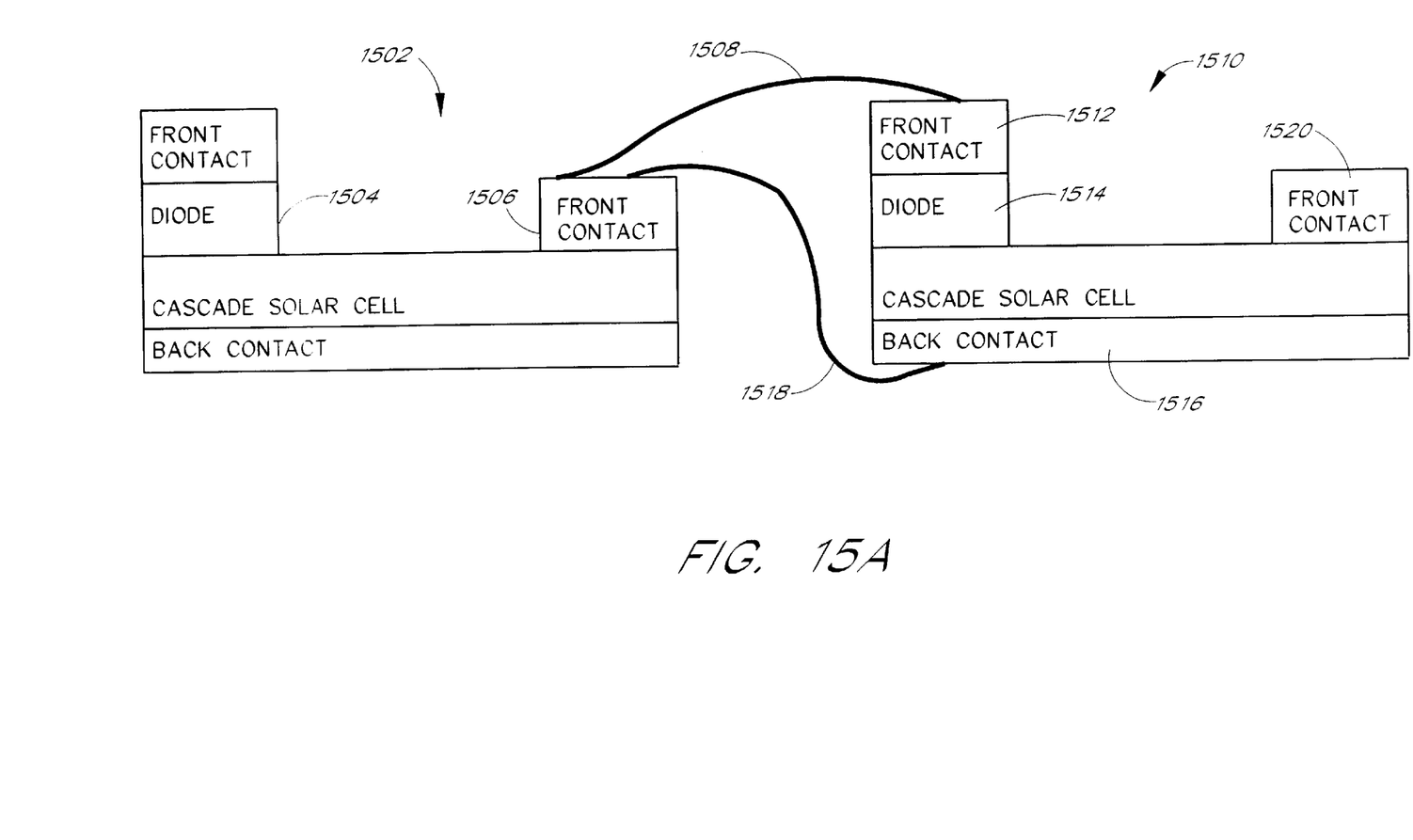
FIG. 15A illustrates a first method of interconnecting solar cells.

FIG. 15A illustrates one method of interconnecting in series solar cells having integral bypass diodes. By way of example, two solar cells 1502, 1510, with corresponding integral bypass diodes 1504, 1514, are interconnected to form a solar cell string 1500. A first interconnect 1508 is connected to a front contact 1506, overlaying cascaded cells of the solar cell 1502, and to a front contact 1512, overlaying the integral bypass diode 1514 of the solar cell 1510, thereby electrically coupling the solar cells 1502, 1510. The first interconnect 1508 may be a jumper bar, wire, or the like. A second interconnect 1518 is connected to the front contact 1506 of the solar cell 1502, and to a back contact 1516 of the solar cell 1510. The second interconnect 1518 may be a z-tab, wire, or the like. In the illustrated embodiment, the bypass diodes 1504, 1514 are conveniently located on the edge or side opposite the Ohmic cell contact pads 1506, 1520.

Figure 15B:
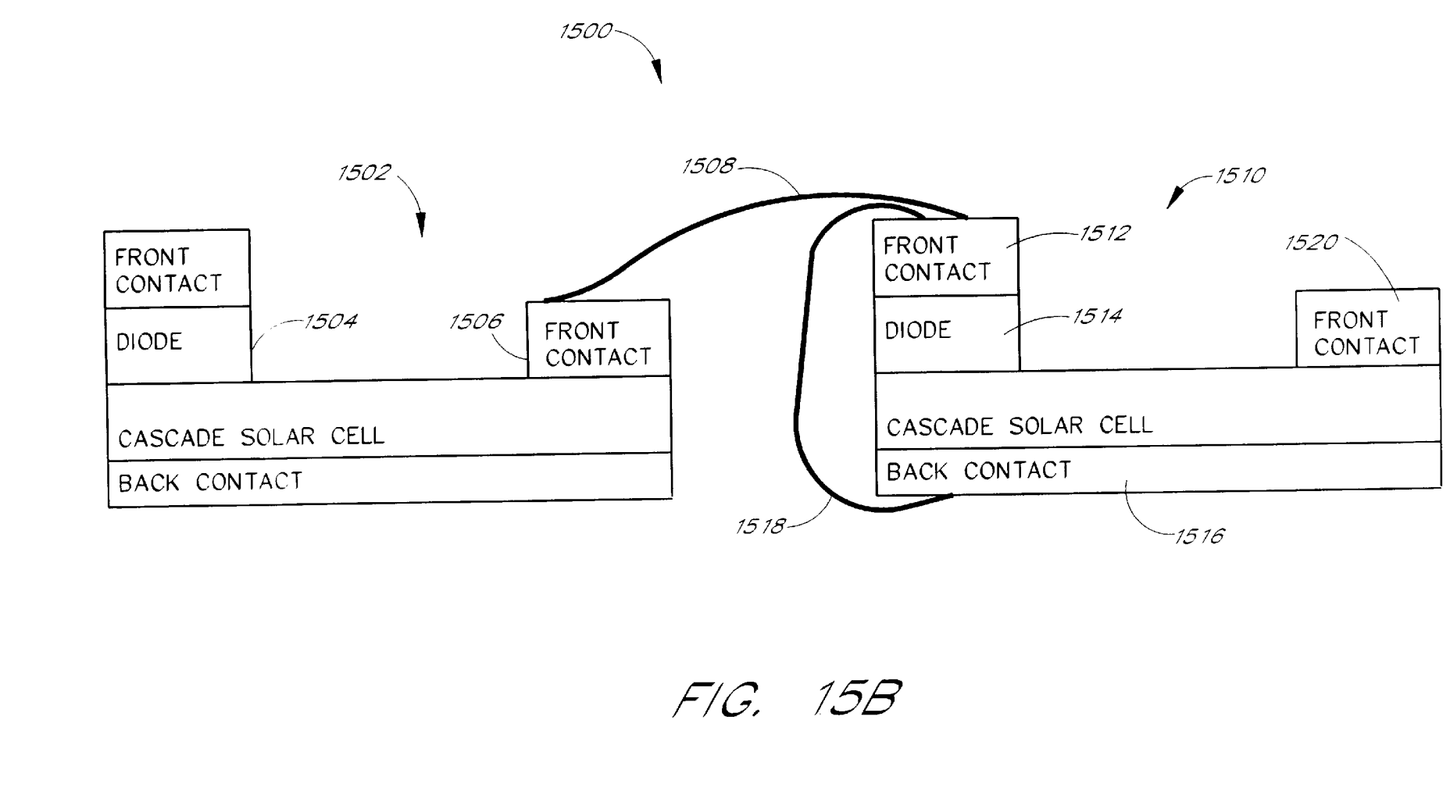
FIG. 15B illustrates a second method of interconnecting solar cells.

FIG. 15B illustrates another method of interconnecting in series solar cells having integral bypass diodes. As in the previous example, the first interconnect 1508 is connected to the front contact 1506 of the solar cell 1502, and to the front contact 1512 of the solar cell 1510. The second interconnect 1518 is connected to the front contact 1512 and to the back contact 1516 of the solar cell 1510. The second interconnect 1518 may be a C-clamp, wire, or the like. This embodiment can advantageously use only one interconnect between two adjacent cells, and the series connection between the cells can be made on the front surfaces of the cells. Thus, by way of example, the cells can first have their corresponding C-clamps individually affixed by the cell manufacturer. The solar cell panel assembler can then appropriately position the cells in long strings, and then interconnect the front contacts of the cells as illustrated in FIG. 15B. This procedure can provide for the efficient, high yield manufacture of solar cells, solar cell strings, and solar cell panels.

While certain preferred embodiments of the invention have been described, these embodiments have been presented by way of example only, and are not intended to limit the scope of the present invention.

What is claimed is:

1. A protected multijunction solar cell circuit comprising:

a multijunction solar cell structure including at least a first photovoltaic cell having a first photoactive junction therein and a second photovoltaic cell having a second photoactive junction therein overlaying at least a portion of said first photovoltaic cell; and an epitaxially grown diode overlaying at least a portion of said multijunction solar cell structure, said epitaxially grown diode having a photoactive junction therein;

wherein said epitaxially grown diode is eletrically connected across said at least first and second photovoltaic cells to protect said at least first and said second photovoltaic cells against reverse biasing.

2. The protected multijunction solar cell circuit as defined in claim 1, wherein said solar cell circuit is formed from at least Group III and Group V elements.

3. The protected multijunction solar cell circuit as defined in claim 1, wherein said multijunction solar cell structure further comprises a window layer located between said epitaxially grown diode and said second photovoltaic cell.

4. The protected multijunction solar cell circuit as defined in claim 1, further comprising a germanium substrate.

5. The protected multijunction solar cell circuit as defined in claim 1, further comprising a GaAs substrate.

6. The protected multijunction solar cell circuit as defined in claim 1, further comprising an insulating substrate.

7. The protected multijunction solar cell circuit as defined in claim 1, wherein said bypass diode is space qualified to operate in an AM 0 environment.

8. The protected multijunction solar cell circuit as defined in claim 1, further comprising a third photovoltaic cell between said first photovoltaic cell and said second photovoltaic cell.

9. The protected multijunction solar cell circuit as defined in claim 8, further comprising a fourth photovoltaic cell between said first photovoltaic cell and said second photovoltaic cell.

\* \* \* \* \*